United States Patent
Yu et al.

(10) Patent No.: US 9,768,119 B2
(45) Date of Patent: Sep. 19, 2017

(54) APPARATUS AND METHOD FOR MITIGATING DYNAMIC IR VOLTAGE DROP AND ELECTROMIGRATION AFFECTS

(71) Applicant: Taiwan Semiconductor Manufacturing Co., Ltd., Hsin-Chu (TW)

(72) Inventors: Chih-Yeh Yu, Hsinchu (TW); Yuan-Te Hou, Hsinchu (TW); Chung-Min Fu, Chungli (TW); Wen-Hao Chen, Hsin-Chu (TW); Wan-Yu Lo, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 291 days.

(21) Appl. No.: 13/859,797

(22) Filed: Apr. 10, 2013

(65) Prior Publication Data

US 2014/0264924 A1  Sep. 18, 2014
US 2017/0133321 A9  May 11, 2017

Related U.S. Application Data

(63) Continuation-in-part of application No. 12/845,162, filed on Jul. 28, 2010, now Pat. No. 8,431,968.
(Continued)

(51) Int. Cl.
H01L 27/02  (2006.01)
H01L 23/52  (2006.01)
(Continued)

(52) U.S. Cl.
CPC ........ *H01L 23/5286* (2013.01); *H01L 21/768* (2013.01); *H01L 23/5283* (2013.01)

(58) Field of Classification Search
CPC ............. H01L 27/0207; H01L 23/5286; H01L 27/11807; H01L 27/118; H01L 23/528;
(Continued)

(56) References Cited

U.S. PATENT DOCUMENTS

6,396,087 B1 * 5/2002 Kitabayashi ........ H01L 27/0207
257/204
6,838,713 B1 * 1/2005 Gheewala ......... H01L 27/11807
257/211
(Continued)

*Primary Examiner* — Allen Parker
*Assistant Examiner* — Didarul Mazumder
(74) *Attorney, Agent, or Firm* — Duane Morris LLP (57) ABSTRACT

An integrated circuit structure includes a plurality of power or ground rails for an integrated circuit, the plurality of power or ground rails vertically separated on a plane, a plurality of functional cells between the plurality of power rails or between the plurality of ground rails or both, and a jumper connection between the vertically separated power rails or ground rails, the jumper connection within a vertically aligned gap among the plurality of functional cells. A method of mitigating IR drop and electromigration affects in an integrated circuit includes forming a plurality of power rails or ground rails, each of the power rails or ground rails on separate vertical levels of a plane of an integrated circuit layout and connecting with a jumper connection at least two power rails or two ground rails, the jumper connection within a vertically aligned gap among cells of the integrated circuit.

17 Claims, 6 Drawing Sheets

Related U.S. Application Data (60) Provisional application No. 61/781,578, filed on Mar. 14, 2013.

(51) Int. Cl.
*H01L 27/11* (2006.01)
*H01L 29/00* (2006.01)
*H01L 23/528* (2006.01)
*H01L 21/768* (2006.01)

(58) Field of Classification Search
CPC ... H01L 2924/0002; H01L 2027/11881; H01L 2924/00
USPC ......... 257/202, 207–211, 774; 438/629, 637, 438/639, 640, 667, 668, 672, 675, 700, 438/701, 713, 978
See application file for complete search history.

(56) References Cited

U.S. PATENT DOCUMENTS

| | | | |
|---|---|---|---|
| 7,039,821 B1 | 5/2006 | Potega | |
| 7,127,623 B2 | 10/2006 | Potega | |
| 7,829,997 B2 | 11/2010 | Hess et al. | |
| 8,001,516 B2 | 8/2011 | Smith et al. | |
| 2004/0222442 A1* | 11/2004 | Komaki | 257/202 |
| 2005/0276132 A1* | 12/2005 | Severson | H03K 19/0016 365/202 |
| 2006/0226530 A1* | 10/2006 | Dinter | G06F 17/5068 257/691 |
| 2007/0283310 A1* | 12/2007 | Hiraga | G11C 5/141 257/207 |
| 2008/0222588 A1* | 9/2008 | Nonaka | G06F 17/5072 716/122 |
| 2011/0024869 A1* | 2/2011 | Nakajima | G06F 17/5072 257/499 |
| 2012/0025273 A1* | 2/2012 | Lu et al. | 257/211 |

* cited by examiner

Example Layout of Jumper
Using M0_OD to connect M1 power Rails

FIG. 4

Jumper cell insertion

Dynamic IR improvement from jumper

| Condition  | Dynamic IR | Effective R |
|------------|------------|-------------|
| w/o jumper | 59.95mV    | 22.71Ω      |
| with jumper| 50.29mV    | 18.76Ω      |

Self-assemble single height jumpers

FIG. 11

Triple height jumper for both VDD and VSS

APPARATUS AND METHOD FOR MITIGATING DYNAMIC IR VOLTAGE DROP AND ELECTROMIGRATION AFFECTS

CROSS-REFERENCE TO RELATED APPLICATIONS

This application claims the benefit of U.S. Provisional Application No. 61/781,578, filed Mar. 14, 2013, which application is expressly incorporated by reference herein in its entirety. This application is a continuation in part of prior co-pending U.S. application Ser. No. 12/845,162 (U.S. Pub. No. 2012/0025273) filed Jul. 7, 2010 (now U.S. Pat. No. 8,431,968).

TECHNICAL FIELD

The disclosure is related to a method and apparatus for mitigating dynamic IR voltage drop and electromigration (EM) affects in a semiconductor device or integrated circuit.

BACKGROUND

A conductor that connects between two points in a circuit has an electrical resistance R determined by the conductor material and dimensions. The conductor carries a current I proportional to the difference V in voltage between such points, according to Ohm's Law: V=IR. When an electrical load in a circuit is supplied with current from a supply voltage through a conductor, the voltage at the load is equal to the supply voltage level less a voltage drop equal to the product of the resistance of the conductor times the current passing through the conductor. Depending on the operational state of the circuit, loads may draw a variable amount of current at any given time. The operational state of the circuit varies with the conductive state of switching elements and with the input stimulus and output voltages and currents, whether reactive elements are charging or discharging, etc.

Circuit loads are coupled across a potential difference by two conductors, i.e., between different voltages. An IR voltage drop occurs along a conductor carrying current from a $V_{DD}$ supply voltage (or other reference) to the more positive terminal of the load, leading to a reduced supply voltage at that terminal. IR voltage drop considerations are important during integrated circuit design and planning stages. Alternative circuit layouts can be considered in view of the expected IR voltage drop conditions and the requirements of the load devices. IR drops are calculated based on the resistivity of the conductor material, the cross sectional dimensions of the conductor, the length of the conductor between defined points, typical operational states of the circuit such as the number of switching elements toggling simultaneously, and the expected current loading. If it appears that a load device may be adversely affected by IR voltage drop conditions, the load device may be moved to a location closer to a more regulated source along the power supply rails, i.e., to reduce conductor length, or the conductors can be made wider or thicker, in either case reducing their resistance.

Accounting for the IR drops associated with loads can be a complicated matter due, for example, to the complexity and variable shapes of conductive paths. Some programmed layout planning systems have a function for estimating IR voltage drop. A designer might choose power rail conductors that are more than sufficient in number and size, but this uses scarce circuit area. Electromigration or EM hotspots in a power grid is also a consideration.

BRIEF DESCRIPTION OF THE DRAWINGS

There are shown in the drawings certain exemplary embodiments intended to illustrate aspects of the subject matter disclosed. The subject developments are not limited to the embodiments illustrated as examples, and reference should be made to the claims to assess the scope of the subject matter. In the drawings.

DETAILED DESCRIPTION

Figure 1:
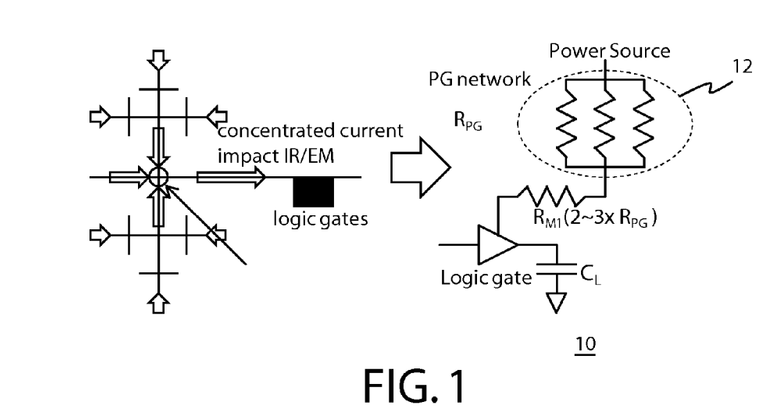
FIG. 1 is a diagram schematically representing a typical IR drop and EM scenario attributable to resistance on a first metal layer (M1) power rail of a two-dimensional power grid network.

FIG. 1 is a simplified illustration of an integrated circuit or cell 10 having a two dimensional power grid network that supplies a load such a logic gate or gates. The metalized layer (M1) used for the power grid is typically made from runners having an inherent power grid resistance 12 or Rpg. Currents are distributed to a 2-D power grid network and get concentrated. As illustrated on the left-hand-side of FIG. 1, the concentrated current directed to the logic gate or load has an adverse impact in the form of an IR drop and/or electromigration issues. This disclosure is applicable to various specific integrated circuit types, and accordingly the specific elements on the integrated circuit or cell 10 are not shown in detail. The elements are defined and can be connected to one another by a potentially complex layout of overlapping, connecting or bypassing layers of N and P semiconductor materials forming transistors and diodes, metal oxide gates, polysilicon or metal oxide conductors and other similar elements. The integrated circuit 20 of FIG. 2 further illustrates the concentrated current flow through a long horizontal M1 rail which induces high IR dynamic drop and EM hotspots. In particular, power rails 22 and 26 (Vdd) are coupled together via power stripes 23 and 29 and power rails 24 and 28 (Vss) are coupled together via power stripes 21 and 27. Concentrated current flows through the horizontal M1 rail 26 towards the functional cell 25.

Figure 2:
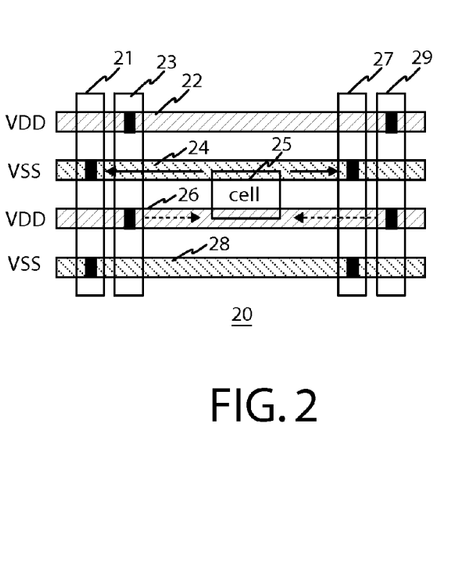
FIG. 2 is a top plan view of an integrated circuit layout illustrating concentrated current flow through long horizontal M1 rails, inducing high IR and EM affects.

The conductors have a characteristic resistance, and a voltage drop that occurs along the conductors between the supplies and the load terminals, which drop is a function of the conductor resistance and the amplitude of current flowing, in each incremental part of the conductor back to the reference voltages. The M1 power rail is a bottleneck of a power grid for an integrated circuit. Furthermore, resistance on M1 increases due to the power grid with process scaling. Although reducing the power grid pitch can reduce the M1 bottleneck, such reduction in the power grid pitch comes at the cost of routing resources and space in general. Other techniques to mitigate IR drop or EM experienced on the M1 metalization layer usually comes at the expense of routing resource. Using an extra M2 metalization power rail increases the difficulty of pin access. Reducing power pitch creates more routing blockage on all routing layers. Adding vertical power stripes effects signal RC and timing and also increases the difficulty for implementing engineering change orders (ECO).

Figure 3:
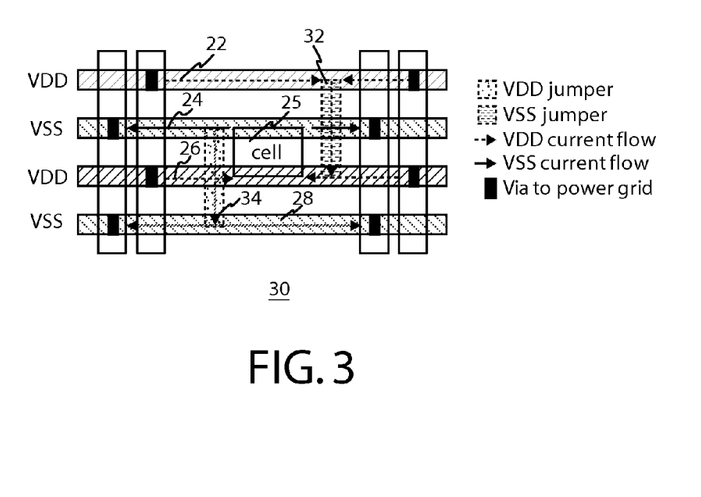
FIG. 3 is a top plan view of an integrated circuit layout illustrating vertical short-cuts or "jumper connections" that divert current to other M1 rail(s), reducing effective resistance to power source in accordance with an embodiment.
Figure 4:
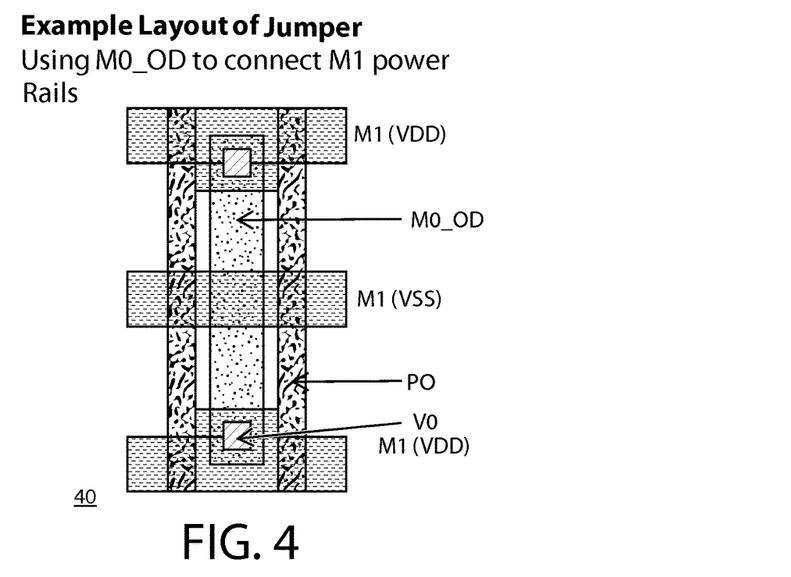
FIG. 4 is a top plan view of a jumper cell using an oxide diffusion layer (M0-OD) and vias (V0) to connect separate "horizontal" M1 power rails in accordance with an embodiment.

Thus, embodiments herein provide an apparatus and method to mitigate IR drop and EM affects without the extra area or routing resource penalty common with existing solutions. Referring to FIG. 3, the integrated circuit layout 30 illustrates a top plan view similar to the integrated circuit of FIG. 2, but further includes a Vdd jumper connection or jumper cell 32 between Vdd power rail 22 and Vdd power rail 26. The integrated circuit 30 further includes a Vss jumper connection or jumper cell 34 between Vss power rail 24 and Vss power rail 28. The vertical short-cuts divert current to other M1 rails and reduce the effective resistance to the power source. Accordingly, the integrated circuit 30 reduces IR drop and eliminates EM hot spots without impacting area resources and routing resources. Further note that existing cells in an integrated circuit can be modified to provide the vertical short-cut connections between M1 rails. For example, filler cells, decoupling capacitor cells, tap cells, or boundary cells can be modified to provide such jumper connections or jumper cells. In other words, non-routing layers (such M1, M0, gate or Diffusion layers) can be used to create vertical stripes, connect neighbor power rails or ground rails. For example, in FIG. 4, a jumper cell layout 40 uses a combination of M0, oxidation layer (OD) and a polysilicon layer (PO) to couple neighboring M1 power rails (Vdd).

Figure 5:
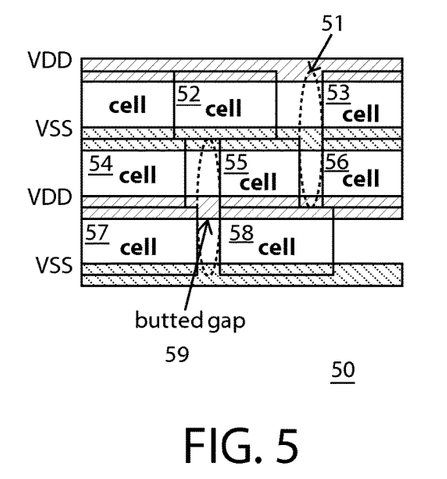
FIG. 5 is a top plan view of an integrated circuit layout illustrating vertically aligned butted gaps between functional cells used for placing "jumper connections" or jumper cells between power rails or ground rails in accordance with an embodiment.
Figure 6:
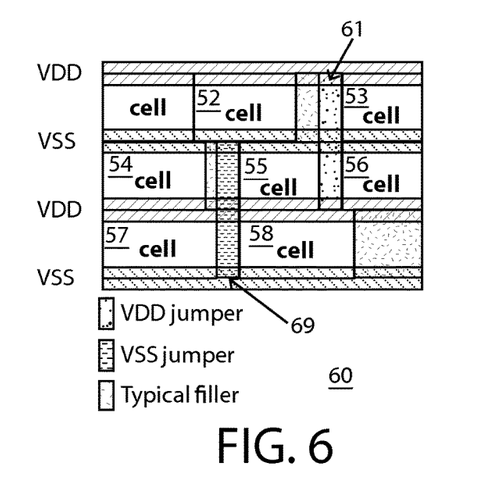
FIG. 6 is the top plan view of the integrated circuit layout of FIG. 5 illustrating the jumper cells placed in the vertically aligned butted gap(s).

Referring to the integrated circuit layout 50 of FIG. 5, functional cells 52-58 can be vertically aligned to create a gap such as a butted gap 51 or butted gap 59 where a jumper connection or jumper cell can be inserted. Thus, a vertically aligned gap can be found in the design. In the integrated circuit layout 60 of FIG. 6, a jumper cell 61 can be placed in the vertical butted gap 51 of FIG. 5 between power rails (Vdd) and thus enhancing the power grid network performance. Similarly, a jumper cell 69 can be placed in the vertical butted gap 59 of FIG. 5 between power rails (Vss). As explained above, the jumper cells 61 and 69 can be modified filler cells, decoupling capacitor (or decap) cells, tap cells, or boundary cells containing vertical stripes (jumper cell) where the jumper cells are placed randomly or purposely in a formed gap to enhance IR drop and electromigration issues. Note that when a jumper cell is inserted into a butted gap, power rails or ground rails can be vertically connected automatically.

Figure 7:
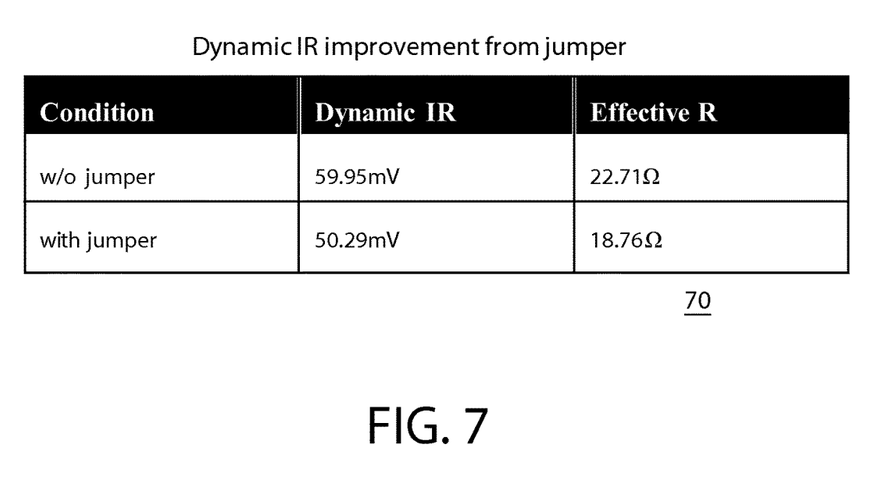
FIG. 7 is a chart illustrating the dynamic IR improvement using jumper connections in one embodiment.

Referring to FIG. 7, an exemplary chart 70 illustrates the dynamic IR improvement using a jumper connection or jumper cell. In one embodiment, the dynamic IR and effective resistance went from 59.95 mV and 27.71 Ohms without a jumper cell to 50.29 mV and 18.76 Ohms respectively using a jumper cell.

Figure 8:
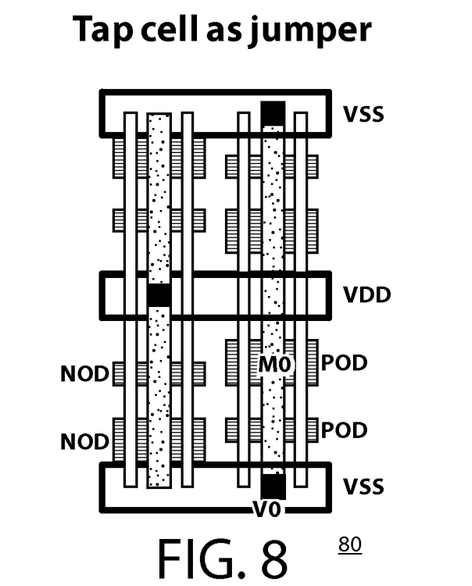
FIG. 8 is a top plan view of an integrated circuit layout illustrating the use of multiple non-routing layers (e.g., M0, M1, poly, and OD) to serve as a jumper connection in accordance with an embodiment.

Referring to FIG. 8, a top plan view of an integrated circuit layout 80 illustrates the use of tap cells as jumper connections in accordance with an embodiment. The use of tap cells and filler cells converted to jumper cells enables the improved IR and EM performance within the same footprint of an existing layout.

Figure 9:
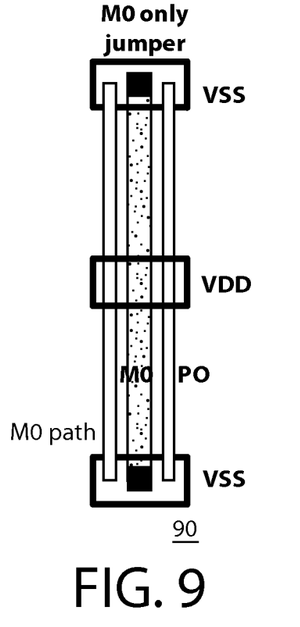
FIGS. 9-10 illustrate the conversion of filler or filler cells into jumper cells within an existing footprint in accordance with an embodiment herein.
Figure 10:
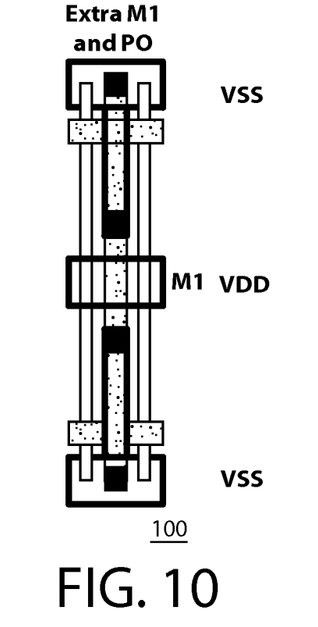

The top plan views of cell layouts 90 and 100 of FIGS. 9 and 10 illustrate the conversion of filler or filler cells into jumper cells within an existing footprint in accordance with an embodiment herein. In layout 90, M0 is used to couple adjacent or neighboring power rails Vdd. In layout 100, M0, extra M1, and polysilicon layers are used to couple the power rails Vdd.

Figure 11:
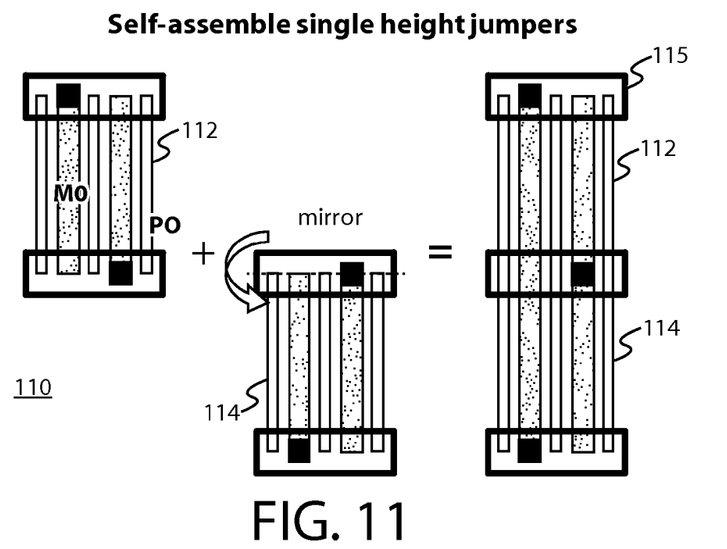
FIGS. 11-12 illustrate the use of self-assembled single height jumpers into double (FIG. 11) and triple (FIG. 12) height jumpers for Vdd or Vss or both in accordance with an embodiment herein.
Figure 12:
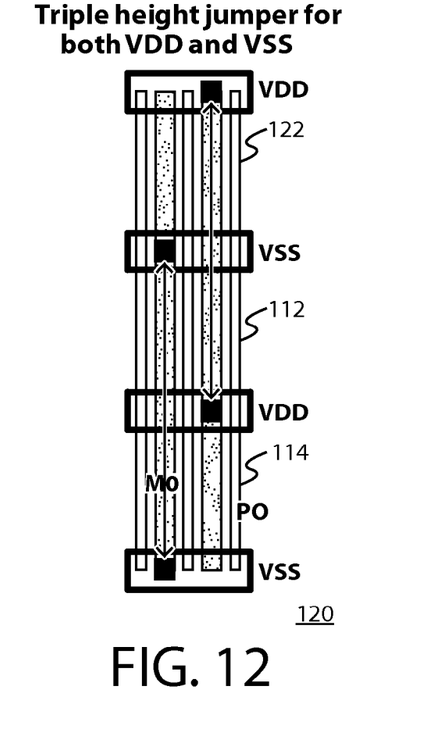

Referring to FIGS. 11 and 12, self-assembled single height jumpers are used to form into double (FIG. 11) and triple (FIG. 12) height jumpers for Vdd or Vss or both in accordance with an embodiment herein. In the layout 110 of FIG. 11, a jumper cell 112 and a mirror image 114 of jumper cell 112 are stacked on one another to form a double height jumper 115. In the layout 120 of FIG. 12, an additional mirror image 122 of jumper cell 112 is stacked on the double height jumper 115 to form a triple height jumper for both Vdd and Vss. Using these techniques, a jumper cell can be a double height, triple height, or any additional multiple height cell where multiple power nets can be connected into one jumper cell.

Figure 13:
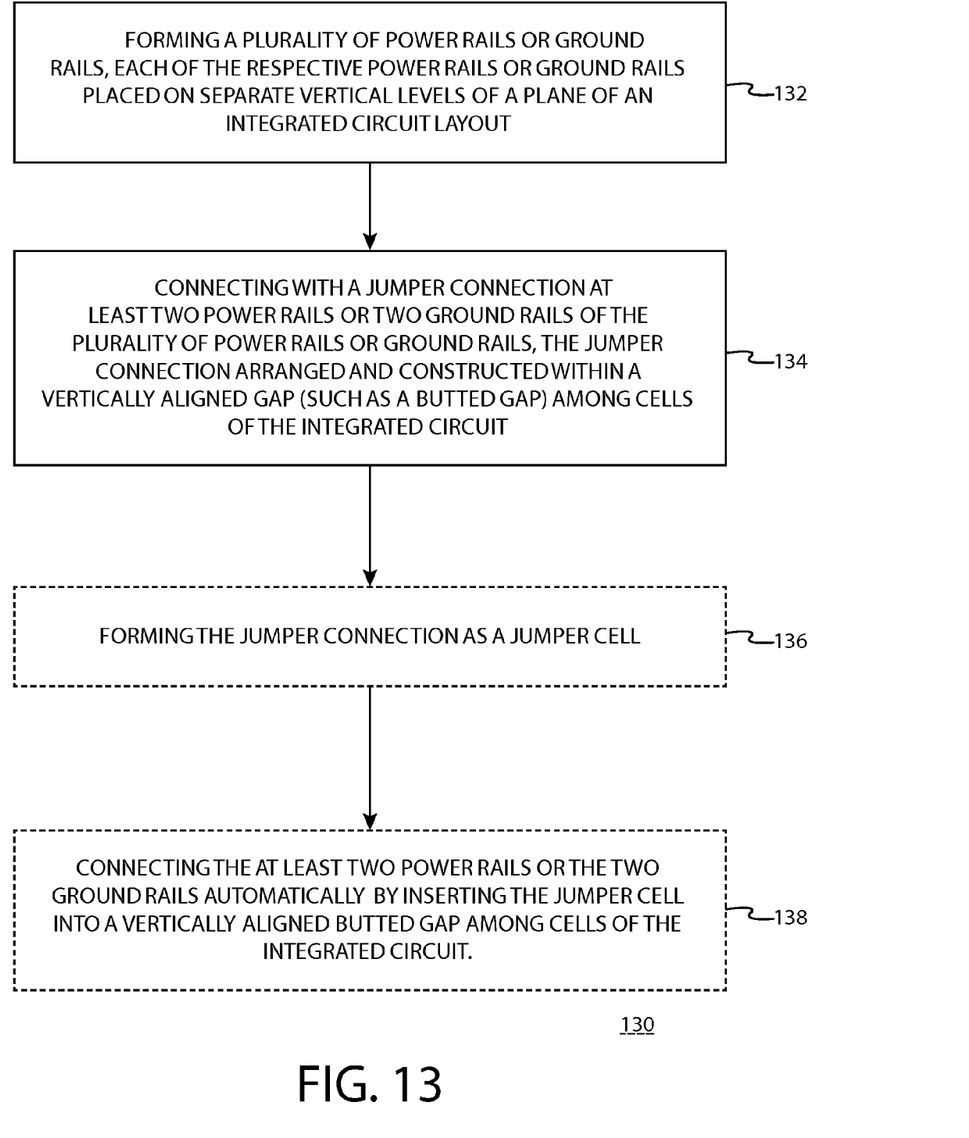
FIG. 13 is a flow chart illustrating a method of mitigating IR drop and electromigration affects in an integrated circuit in accordance with an embodiment herein.

In one embodiment, the flow chart of FIG. 13 illustrates a method 130 of mitigating IR drop and electromigration in an integrated circuit in accordance with an embodiment herein. The method 130 can include forming at 132 a plurality of power rails or ground rails, each of the respective power rails or ground rails placed on separate vertical levels of a plane of an integrated circuit layout and connecting at 134 with a jumper connection at least two power rails or two ground rails of the plurality of power rails or ground rails, the jumper connection arranged and constructed within a vertically aligned gap among cells of the integrated circuit. The vertically aligned gap can be a butted gap within the integrated circuit. At 136, forming the jumper connection can be done as a jumper cell. At 138, connecting the at least two power rails or the two ground rails can be done automatically by inserting the jumper cell into a vertically aligned butted gap among cells of the integrated circuit.

In another embodiment, an integrated circuit structure can include a plurality of power rails or ground rails of a power grid for an integrated circuit where the plurality of power rails or ground rails being vertically separated on a plane of the integrated circuit, a plurality of functional cells between the plurality of power rails or between the plurality of ground rails or both, and a jumper connection between at least two of the vertically separated power rails or between at least two of the vertically separated ground rails, the jumper connection arranged and constructed within a vertically aligned gap among the plurality of functional cells. The vertically aligned gap can be a butted gap within the integrated circuit structure where the gap between functional gates of cells are randomly butted in a vertical direction or where the gap between functional gates of cells are purposely butted in a vertical direction. The jumper connection can be a jumper cell where the jumper cell is one of a modified filler, a modified decoupling capacitor cell, a modified tap cell, or a modified boundary cell. The power rails or ground rails can be connected using non-routing layers such as a metal layer, a via layer, a polysilicon layer, or an oxide diffusion layer. Note, a footprint of the integrated circuit structure remains the same with an addition of the jumper connection between the at least two vertically separated power rails or ground rails. Further note, a tap cell, for example, can form the jumper connection between the at least two vertically separated power rails or ground rails. Also note that the jumper connection can be formed from at least two or more self-assembled single height cells.

In yet another embodiment, an integrated circuit can include a substrate, at least a first power rail on a first domain and formed by a first metal layer on the substrate, the first power rail having a plurality of vertically separated first power rail portions on a plane of the substrate, at least a second power rail on a second domain and formed by the first metal layer, the second power rail vertically separated from the first power rail on the plane of the substrate, the second power rail having a plurality of vertically separated second power rail portions on the plane of the substrate, and a plurality of cells in an integrated circuit layout interspersed among the first power rail portions and the second power rail portions, and further arranged to have at least one vertically aligned gap between at least two of the first power rail portions or between at least two of the second power rail portions. The integrated circuit further includes a jumper connection formed within the at least one vertically aligned gap to connect at least one of the first power rail portions to another one of the first power rail portions or to connect at least one of the second power rail portions to another one of the second power rail portions, or both. The vertically aligned gap is a butted gap within the integrated circuit. The first power rail portions or the second power rail portions are connected using non-routing layers. The second power rail or power rail portions can be a ground rail. Further note that the footprint of the integrated circuit remains the same with an addition of the jumper connection between the first power rail portions or the jumper connection between the second power rail portions.

The preceding merely illustrates the principles of the disclosure. It will thus be appreciated that those skilled in the art will be able to devise various arrangements which, although not explicitly described or shown herein, embody the principles of the disclosure and are included within its spirit and scope. Embodiments can include, but are not limited to any jumper connection or jumper cell or method of using same to mitigate IR drop or electromigration issues. Such embodiments provide a cost-effective and easy method, apparatus and system to implement a solution that does not necessarily utilize additional area or routing resources.

Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "to", "from", "lower," "upper," "horizontal," "vertical," "above," "below," "up," "down," "before", "after", "top" and "bottom" as well as derivatives thereof (e.g., "horizontally,", "vertically", "downwardly," "upwardly," etc.) should be construed to refer to the orientation as then described or as shown in the drawing under discussion. The drawings are arbitrarily oriented for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments, which can be made by those skilled in the art without departing from the scope and range of equivalents.

We claim:

1. An integrated circuit structure, comprising:
    a plurality of first horizontal power rails and a plurality of second horizontal power rails of a power grid for an integrated circuit, the plurality of first horizontal power rails and the plurality of second horizontal power rails being on a plane of the integrated circuit;
    a plurality of functional cells placed between the plurality of first and second horizontal power rails, wherein the plurality of functional cells are vertically aligned to create a vertical gap among the functional cells; and
    a jumper cell arranged and constructed within the vertical gap among the plurality of functional cells, wherein the jumper cell is one of a modified filler cell or a modified decoupling capacitor cell configured and placed within the vertical gap to mitigate IR drop and electromigration.

2. The integrated circuit structure of claim 1, wherein the vertically aligned gap is a butted gap within the integrated circuit structure.

3. The integrated circuit structure of claim 1, wherein the jumper cell is randomly placed in the vertical gap.

4. The integrated circuit structure of claim 1, wherein the jumper cell is purposely placed in the vertical gap.

5. The integrated circuit structure of claim 1, wherein the first horizontal power rails and the second horizontal power rails are connected using non-routing layers.

6. The integrated circuit structure of claim 5, wherein the non-routing layers comprises one of a metal layer, a via layer, a polysilicon layer, or an oxide diffusion layers.

7. The integrated circuit structure of claim 1, wherein a footprint of the integrated circuit structure remains the same with an addition of the jumper cell in the vertical gap.

8. The integrated circuit structure of claim 1, wherein a tap cell forms the jumper cell in the vertical gap.

9. The integrated circuit structure of claim 1, wherein the jumper cell is formed from at least two or more self-assembled single height cells.

10. An integrated circuit, comprising:
a substrate;
at least a first power rail on a first domain and formed by a first metal layer on the substrate, the first power rail having a plurality of first horizontal power rail portions on a plane of the substrate;
at least a second power rail on a second domain and formed by the first metal layer, the second power rail having a plurality of second horizontal power rail portions on the plane of the substrate;
a plurality of cells in an integrated circuit layout interspersed among the first horizontal power rail portions and the second horizontal power rail portions, and further arranged to have at least one vertically aligned gap created between the cells; and
a jumper cell formed within the at least one vertically aligned gap to connect at least one of the first horizontal power rail portions to another one of the first horizontal power rail portions or to connect at least one of the second horizontal power rail portions to another one of the horizontal second power rail portions, wherein the jumper cell is one of a modified filler cell or a modified decoupling capacitor cell configured and placed within the vertical gap to mitigate IR drop and electromigration.

11. The integrated circuit of claim 10, wherein the vertically aligned gap is a butted gap within the integrated circuit.

12. The integrated circuit of claim 10, wherein the first horizontal power rail portions or the second horizontal power rail portions are connected using non-routing layers.

13. The integrated circuit of claim 10, wherein a footprint of the integrated circuit remains the same with an addition of the jumper cell in the vertically aligned gap.

14. The integrated circuit of claim 10, wherein the second power rail is a ground rail.

15. A method of mitigating IR drop and electromigration affects in an integrated circuit, comprising:
forming a plurality of first horizontal power rails and a plurality of second horizontal power rails, each of the respective horizontal power rails second horizontal power rails placed on a plane of an integrated circuit layout; and
placing a plurality of functional cells between the plurality of first and second horizontal power rails, wherein the plurality of functional cells are vertically aligned to create a vertical gap between the functional cells;
connecting with a jumper cell at least two of the first horizontal power rails or at least two of the second horizontal power rails, the jumper cell arranged and constructed within the vertical gap among the functional cells of the integrated circuit, wherein the jumper cell is one of a modified filler cell or a modified decoupling capacitor cell configured and placed within the vertical gap to mitigate IR drop and electromigration.

16. The method of claim 15, wherein the vertical gap is a butted gap within the integrated circuit.

17. The method of claim 15, wherein connecting the at least two first horizontal power rails or the two second horizontal power rails is done automatically by inserting the jumper cell into a vertically aligned butted gap among cells of the integrated circuit.

* * * * *